United States Patent

Prill

[15] 3,697,978

[45] Oct. 10, 1972

[54] ANALOG-TO-DIGITAL CONVERTER

[72] Inventor: Robert S. Prill, West Paterson, N.J.

[73] Assignee: The Singer Company, New York, N.Y.

[22] Filed: Oct. 19, 1970

[21] Appl. No.: 81,709

[52] U.S. Cl. ........................................340/347 AD

[51] Int. Cl. ........................................H03k 13/02

[58] Field of Search ..................340/347 AD, 347 NT

[56] References Cited

UNITED STATES PATENTS 3,384,889 5/1968 Lucas..................340/347 AD

*Primary Examiner*—Daryl W. Cook

*Assistant Examiner*—Joseph M. Thesz, Jr.

*Attorney*—S. A. Giarratana and Thomas W. Kennedy

[57] ABSTRACT

An analog signal is held in a capacitor so that the most significant bits of the signal are obtained by parallel conversion and the least significant bits are obtained by a ramp discharge of the capacitor. The converter can convert analog signals having a frequency of 30 MHz by using three channels with each channel having one of the holding capacitors.

14 Claims, 9 Drawing Figures

INVENTOR
ROBERT S. PRILL

BY

ATTORNEYS.

ANALOG-TO-DIGITAL CONVERTER

In the conversion of wideband analog signals to digital signals, the parallel A/D (analog to digital) converter offers the fastest method of performing this conversion. However, the A/D converter requires a comparator for each level of quantization.

Thus, for a six bit parallel A/D converter, 64 comparators are required. When the resolution and accuracy of the conversion is to be seven bits, then 128 comparators are required.

Accordingly, while the parallel A/D converter performs the wideband conversion rapidly, it is unattractive economically and technically because of the large number of comparators required. Furthermore, if several of these parallel A/D converters must be interlaced to perform at the wideband rates of video and radar data, for example, the parallel A/D converter becomes even more undesirable. Thus, while the parallel A/D converter is fast, the disadvantages in the cost and the large number of units required result in the parallel A/D converter not being satisfactory for conversion of wideband analog signals to resolutions and accuracies of seven bits, for example.

The present invention satisfactorily solves the foregoing problems by utilizing a plurality of parallel A/D converters in a multichannel interlaced conversion arrangement. The present invention can obtain resolutions of wideband video and radar types of data to seven bits by employing three-bit parallel A/D converters in each channel to obtain the most significant bits of the analog signal and then using the comparators of the parallel converter in cooperation with a ramp discharge to obtain the least significant bits of the analog signal.

Thus, the converter of the present invention utilizes the parallel conversion technique for the three most significant bits of the analog signal and a ramp conversion for the four least significant bits. Accordingly, the number of comparators for converting a wideband signal to seven bits is substantially reduced when utilizing the A/D converter of the present invention.

The A/D converter of the present invention utilizes a single capacitor in the track and hold circuit during both the parallel conversion and the ramp conversion. Thus, the holding capacitor is multiplexed.

The capacitor performs its normal voltage storage duty during the three-bit parallel conversion. Then, during ramp conversion of the signal to the least significant bits, the capacitor generates a voltage ramp through a constant current source with the comparators of the parallel three-bit A/D converter being employed to determine the ramp discharge time.

The present invention also reduces the equipment required for the output signals through utilizing a single output accumulator. Thus, the output from each of the channels is supplied through the same output means.

An object of this invention is to provide an A/D converter in which a parallel A/D converter is multiplexed during each conversion of the signal therein.

Another object of this invention is to provide an A/D converter in which a plurality of channels is employed for converting the analog signals.

A further object of this invention is to provide an A/D converter for wideband signals.

Still another object of this invention is to provide an A/D converter having a parallel A/D converter that functions as a parallel converter during the first part of the conversion cycle and as a threshold crossing detector during the second part of the conversion cycle when there is a ramp conversion.

Other objects of this invention will be readily perceived from the following description, claims, and drawings.

The attached drawings illustrate a preferred embodiment of the invention, in which.

Figure 1:
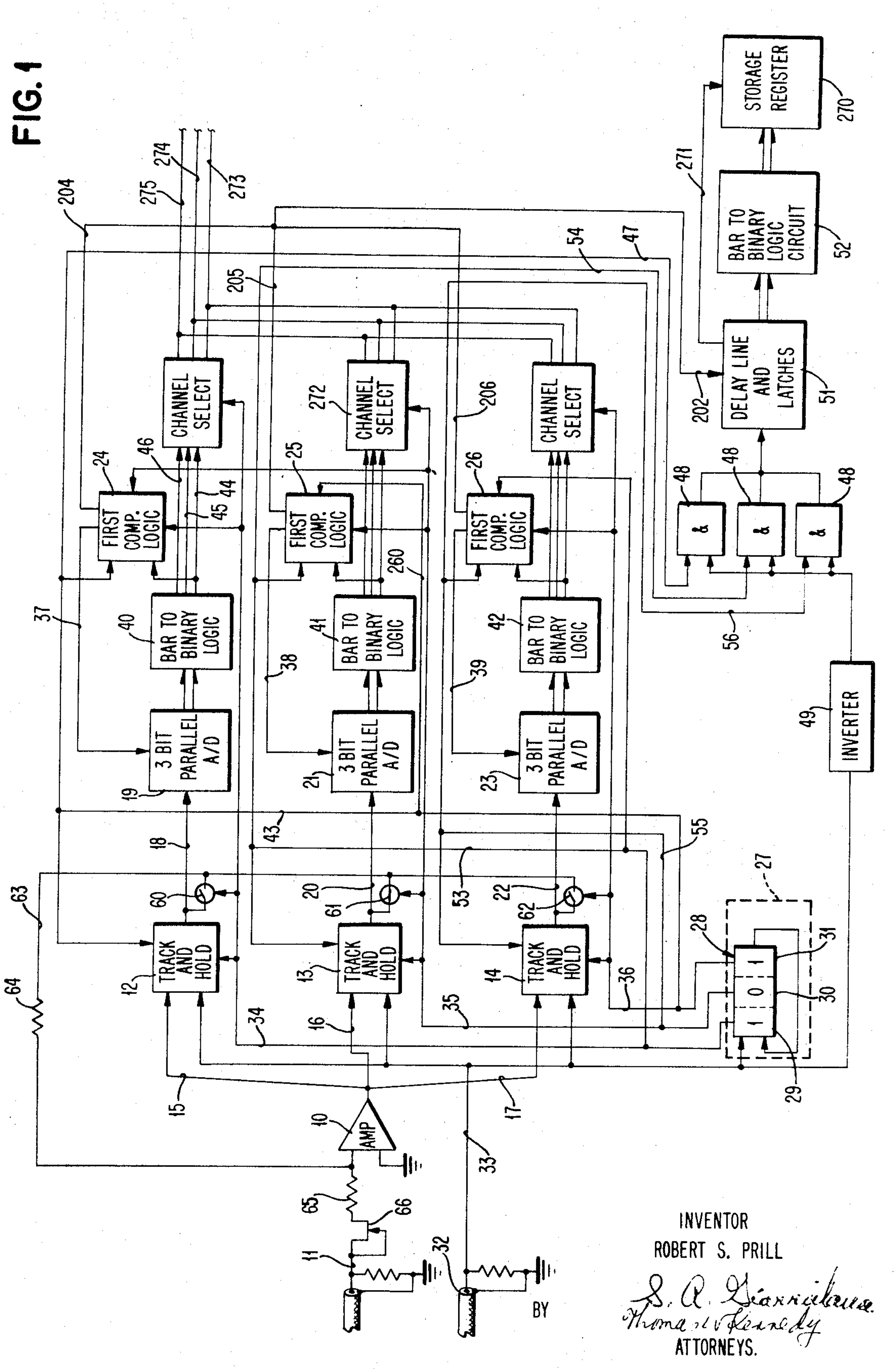
FIG. 1 is a block diagram of the A/D converter of the present invention.

Referring to the drawings and particularly FIG. 1, analog signals are supplied to an inverting amplifier 10 of the A/D converter of the present invention through an input line 11. The amplifier 10 is connected to track and hold circuits 12, 13, and 14 by lines 15, 16, and 17, respectively. The track and hold circuit 12 is part of channel one, the track and hold circuit 13 is part of channel two, and the track and hold circuit 14 is part of channel three.

The track and hold circuit 12 has its output connected through a line 18 to a three-bit parallel A/D converter 19. The track and hold circuit 13 has its output connected through a line 20 to a three-bit parallel A/D converter 21 while the track and hold circuit 14 has its output connected through a line 22 to a three-bit parallel A/D converter 23.

Each of the converters 19, 21, and 23 converts the signal from the track and hold circuits 12, 13, and 14, respectively, to the three most significant bits. Each of the converters 19, 21, and 23 converts the output from the track and hold circuits 12, 13, and 14, respectively, only when a signal is supplied thereto from first comparator threshold cross logic circuits 24, 25, and 26, respectively.

Each of the logic circuits 24, 25, and 26 is connected to a pulse shaper and sequencer 27, which includes a shift register 28 having three stages 29, 30, and 31. A different portion of each of the logic circuits 24–26 is connected to a different one of the stages 29–31.

The shift register 28 is programmed to have a single logical zero (a low) in one of the three stages 29–31 and two logical ones (a high) in the other two stages. Each time that the shift register 28 receives an encode start strobe, the logical zero is shifted to the next stage of the shift register 28. The encode start strobe is supplied to the shift register 28 from a coaxial cable 32, which may be a timing signal from a computer, for example, through a line 33.

Each of the stages 29–31 of the shift register 28 also is connected to one of the track and hold circuits 12 to 14. Thus, the first stage 29 of the shift register 28 is connected through a line 34 to the track and hold circuit 12, the second stage 30 is connected through a line 35 to the track and hold circuit 13, and the third stage 31 is connected to the track and hold circuit 14 through a line 36.

Because of the timing of the signals from the logic circuit 24 through a line 37 to the A/D converter 19, the analog signal, which is held in the track and hold circuit 12 and supplied to the A/D converter 19 through the line 18, is converted only to the most significant bits a predetermined period of time after the track and hold circuit 12 retains the signal received through the line 15. The signal is held in the track and hold circuit 12 by a signal from the first stage 29 of the shift register 28 being supplied to the track and hold circuit 12.

Similarly, the A/D converter 21 receives a signal from the logic circuit 25 through a line 38 only a predetermined period of time after the track and hold circuit 13 has locked the analog signal therein. A signal from the second stage 30 of the shift register 28 locks the analog signal in the track and hold circuit 13 while the signal from the logic circuit 25 causes parallel conversion of the analog signal to the most significant bits.

Likewise, the A/D converter 23 converts the analog signal in the track and hold circuit 14 only to the most significant bits after a signal is supplied to the converter 23 from the logic circuit 26 through a line 39. This occurs a predetermined period of time after the analog signal has been held in the track and hold circuit 14 due to a signal being supplied to the track and hold circuit 14 through a line 36 from the third stage 31 of the shift register 28. Accordingly, the signal on the line 22 is converted to only the three most significant bits a predetermined period of time after the signal has been locked in the track and hold circuit 14.

The output from the A/D converter 19 is supplied to a bar to binary logic circuit 40. The outputs of the converters 21 and 23 are connected to bar to binary logic circuits 41 and 42, respectively. Thus, each of the bar to binary logic circuits 40–42 can have a signal supplied thereto only when there is a low signal on the lines 37, 38, and 39, respectively.

At the same time that the A/D converter 19 is activated to convert the analog signal to only the most significant bits through a low on the line 37 from the logic circuit 24, a low is supplied to the track and hold circuit 12 through a line 43 due to the third stage 31 of the shift register 28 having a logical zero therein. When this occurs, the track and hold circuit 12 has a voltage ramp discharge whereby the A/D converter 19 produces a signal therefrom when the ramp discharge crosses the first threshold.

When the ramp discharge of the track and hold circuit 12 crosses the first threshold, the signal on least significant bit line 44 of three lines 44–46 of the bar to binary logic circuit 40 that indicate the most significant bits changes state. This signal on the line 44 is supplied to the logic circuit 24.

At the same time that the low signal is supplied to the track and hold circuit 12 from the third stage 31 of the shift register 28 through the line 43, it also is supplied through a line 47 to one of a plurality of AND gates 48. One of the inputs to each of the AND gates 48 is from an inverter 49, which is connected to the line 33. The AND gate 48 is connected to a timer 50 (see FIG. 5) of a delay line and latches circuit 51. One suitable example of the timer 50 is a 16 tap delay line in which the signal propogates up the delay line at a rate of 2 nanoseconds per tap.

The signal from one of the AND gates 48 is supplied to the timer 50 only when there is a low signal on both the line 47 and the line out of the inverter 49. Since the high signal on the line 33 not only results in the output of the inverter 49 having a low signal but also produces the low signal on the line 43 to start the ramp discharge, the timer 50 starts to count the time for the discharge of the ramp at the same time that the voltage ramp starts. Accordingly, when the first threshold signal is supplied from the logic circuit 24 to latches in the delay line and latches circuit 51, the timer 50 will have counted the time for the voltage ramp to reach the first threshold. As a result, the signal supplied from the latches of the delay line and latches circuit 51 to a bar to binary logic circuit 52 provide the least significant bits of the analog signal, which has been held in the track and hold circuit 12.

In a similar manner, the timer 50 is activated through lines 53 and 54 to another of the AND gates 48 at the same time that the voltage ramp is started in the track and hold circuit 13 by the low being supplied thereto through the line 53 from the first stage 29 of the shift register 28. Accordingly, when a signal from the first comparator threshold cross logic circuit 25 is provided to indicate that the voltage ramp has crossed the first threshold, signals are supplied to the bar to binary logic circuit 52 that provides the least significant bits of the signal, which is held in the track and hold circuit 13.

Likewise, the timer 50 is activated at the same time that the voltage discharge starts from the track and hold circuit 14. This is accomplished through a signal being supplied from the second stage 30 of the shift register 28 through a line 55 to the track and hold circuit 14 and through the line 55, a line 56, and a third of the AND gates 48 to the timer 50. Accordingly, when the voltage ramp from the track and hold circuit 14 crosses the first threshold in the A/D converter 23, signals are supplied from the delay line and latches circuit 51 to the bar to binary logic circuit 52 to cause the output thereof to represent the least significant bits of the analog signal, which has been held in the track and hold circuit 14.

Each of the track and hold circuits 12, 13, and 14 is connected through switches 60, 61, and 62, respectively, which are field effect transistors, to a feedback line 63, which is connected to the input of the inverting amplifier 10. The feedback line 63 has a resistor 64 therein of the same resistance as a resistor 65 in the input line 11. Accordingly, by controlling the opening and closing of the switches 60–62, there is no saturation of the inverting amplifier 10.

The switch 60 connects the track and hold circuit 12 to the feedback line 63 when the track and hold circuit 14 starts to track a signal for conversion. Thus, the switch 60 is effective during the time when the track and hold circuit 12 is not holding its signal so that the feedback may be supplied to the amplifier 10. This also is when the signal from the previously held signal of the track and hold circuit 12 is being read. The switches 61 and 62 are energized in a similar manner so that there is a feedback whenever the track and hold circuit, which the switch cooperates with, is not holding its signal.

The input line 11 has a switch 66, which also is a field effect transistor. The field effect transistor, which forms the switch 66, has the same characteristics as each of the field effect transistors forming the switches 60, 61, and 62. Accordingly, when any of the switches 60–62 is activated, the impedance of the closed switch will not affect the feedback ratio to the input because of the impedance of the switch 66 in the input line 11. Thus, the one to one ratio between the resistances of the resistors 64 and 65 is maintained irrespective of the impedances of the switches 60–62 because of the switch 66 being in series with the resistor 65.

It should be understood that only one of the switches 60–62 is connected at any particular instance. Thus, each of the switches 60–62 remains energized only until the next of the switches 60–62 is activated.

Figure 2:
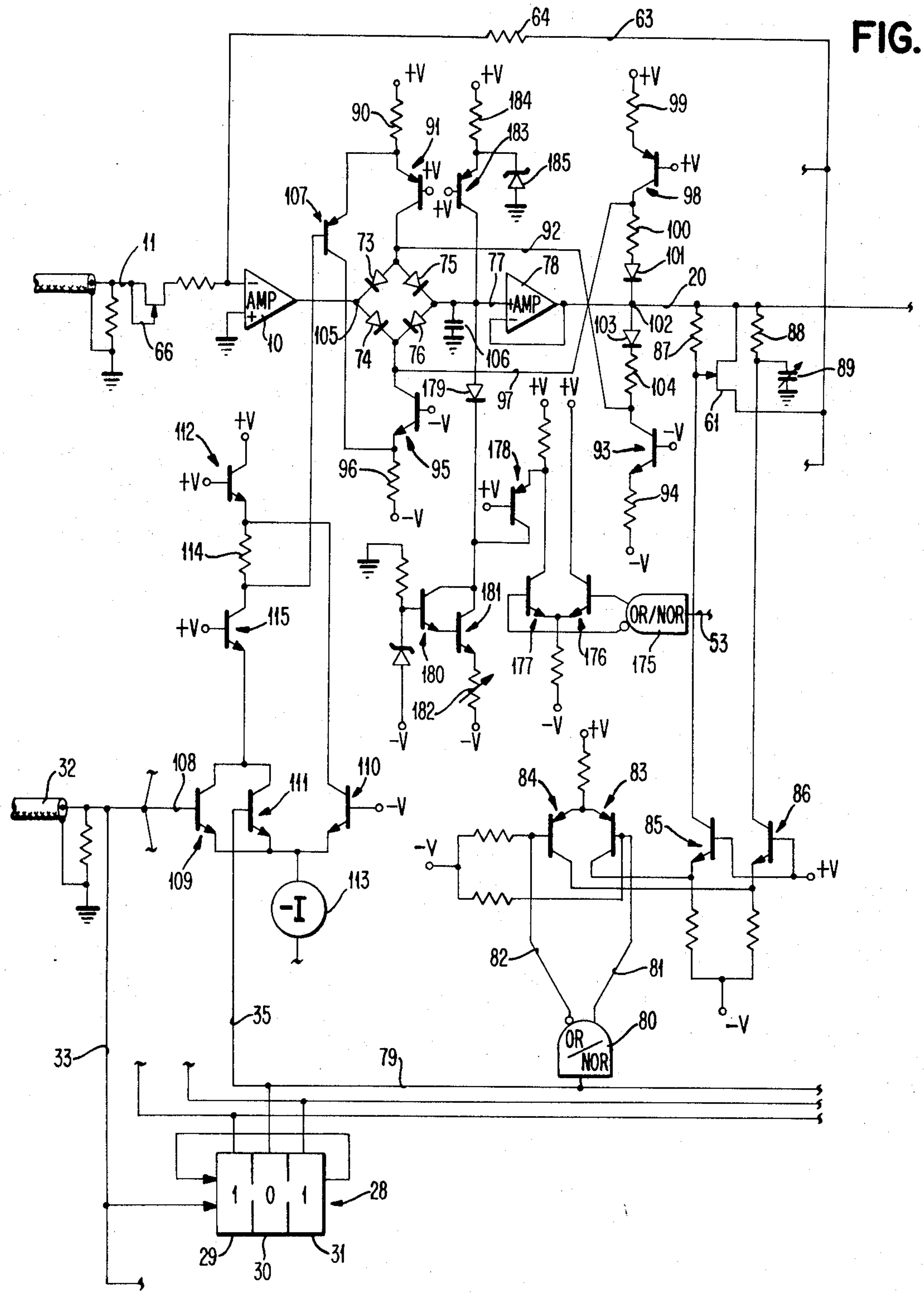
FIG. 2 is a schematic circuit diagram of the track and hold circuit for one of the channels of the A/D converter of FIG. 1.

Referring to FIG. 2, there are shown the details of the track and hold circuit 13 and the pulse shaper and sequencer 27. There also is disclosed how the switch 61 is turned on and off.

As shown in FIG. 2, the logical zero is in the second stage 30, which is connected to the line 35. Thus, the second stage 30 of the shift register 28 is connected to the track and hold circuit 13, which is part of channel two. With the logical zero at the second stage 30, the track and hold circuit 12 of channel one is holding the signal therein, and the track and hold circuit 13 of channel two will next have an analog signal retained therein.

However, at this time, the analog signal from the input line 11 is supplied through the amplifier 10 and the line 16 to a diode bridge circuit, which comprises diodes 73, 74, 75, and 76. The signal flows from the diode bridge circuit through a line 77 to a buffer amplifier 78, which has its output connected to the line 20.

At this time, the switch 61 is closed because the logical zero of the second stage 30 of the shift register 28 is supplied through a line 79 to an OR/NOR gate 80. One suitable example of the gate 80 is sold by Motorola as model No. MC1661 of MECL III MC1600 series with only a single input to the gate being employed.

In the gate 80, the logical signal, which is on the line 79, also appears on a line 81, which is connected to the gate 80, while the inverse of the logical signal appears on a line 82, which also is connected to the gate 80. The line 81 is connected to the base of a PNP transistor 83 while the line 82 is connected to the base of a PNP transistor 84. Accordingly, when there is a logical zero on the line 79, the transistor 83 is conducting while the transistor 84 is turned off since the base of the transistor 84 is more positive than the base of the transistor 83.

The collector of the transistor 83 is connected to the emitter of an NPN transistor 85 while the collector of the transistor 84 is connected to the emitter of an NPN transistor 86. The collector of the transistor 85 is connected through a resistor 87 to the line 20 while the collector of the transistor 86 is connected through a resistor 88 to the line 20.

With the transistor 83 turned on, the transistor 85 is turned off so that no current flows through the resistor 87. As a result, the source and gate terminals of the field effect transistor, which forms the switch 61, are at the same potential so that the field effect transistor, which forms the switch 61, is turned on. Accordingly, current flows through the switch 61 to the feedback line 63.

Because the transistor 84 is turned off, the transistor 86 is turned on whereby there is a voltage drop across the resistor 88, which is the same as the voltage drop across the resistor 87 when the transistor 85 is turned on. Thus, there is no change in the load resistance presented to the line 20 irrespective of which of the transistors 85 and 86 is turned on.

Furthermore, a variable capacitor 89, which is adjusted to have the same capacitance as the switch 61, is connected adjacent the resistor 88. Accordingly, the same capacitance also is presented to the line 20 whereby there is no change in the impedance.

Thus, during the time that the track and hold circuits 12 and 14 are holding analog signals therein, the feedback to the line 63 is supplied through closing of the switch 61. Thus, only the track and hold circuit 13 is tracking the analog signal at this time.

Current is supplied from a voltage source to the diode bridge through a resistor 90 and a PNP transistor 91. The transistor 91 is normally biased on because its base has a much smaller voltage than its emitter. The collector of the transistor 91 is not only connected to the diode bridge but also is connected through a line 92 to the collector of an NPN transistor 93, which has its emitter connected through a resistor 94 to a negative voltage.

Thus, the current flowing through the transistor 91 is divided so that one half flows through the diode bridge and the other half flows through the transistor 93. Accordingly, if the current flowing through the resistor 94 is considered to be I, then the current flowing through the resistor 90 is 2I so that current flowing through the diode bridge is I. Therefore, the current flowing through the diodes 73 and 74 is ½ I and the current flowing through the diodes 75 and 76 is ½ I.

The diode bridge has its point, which is opposite to the point connected to the collector of the transistor 91, connected to the collector of an NPN transistor 95, which has its emitter connected through a resistor 96 to a negative voltage. The collector of the transistor 95 also is connected through a line 97 to the collector of a PNP transistor 98. The transistor 98 has its emitter connected through a resistor 99 to a positive voltage. The magnitude of the current flowing through the transistor 98 is I so that the total current flowing through the transistor 95 is 2I since the current flowing from the diode bridge is I and the current flowing from the transistor 98 is I.

In addition to the collector of the transistor 98 being connected to the collector of the transistor 95 through the lead 97, the collector of the transistor 98 also is connected through a resistor 100 and a diode 101 to a point 102 on the line 20. The point 102 also is connected through a diode 103 and a resistor 104 to the collector of the transistor 93. Thus, the transistors 98 and 93 are connected to each other through the resistor 100, the diodes 101 and 103, and the resistor 104.

As long as the signal from the output of the amplifier 78 equals the negative of the input to the amplifier 10, the current will divide through the two legs of the diode bridge. However, as soon as the analog signal on the input line 11 varies, the signal at point 105 of the diode bridge causes back biasing of one of the diodes 73 and 74. If the signal from the amplifier 10 increases, then the diode 73 is back biased. If the signal from the amplifier 10 decreases, then the diode 74 is back biased.

If the signal at the point 105 is increased with respect to the output of the amplifier 78, the back biasing of the diode 73 causes a holding capacitor 106 to be charged at its maximum rate until the output of the amplifier 78 is equal to the input at the amplifier 10. Likewise, if the input to the amplifier 10 becomes less than the output of the amplifier 78, the diode 74 is back biased. As a result, the capacitor 106 discharges at its maximum rate through the diode 76 and the transistor 95. Because of the high impedance of the buffer amplifier 78, the capacitor 106 cannot discharge through the amplifier 78.

Thus, the amplifier 78 always attempts during the track mode to output on the line 20 the exact negative of that at the input to the amplifier 10. Accordingly, the output of the amplifier 78 at the end of the track period equals the negative of the analog signal supplied to the input line 11.

A PNP transistor 107 is connected between the emitter of the transistor 91 and the emitter of the transistor 95. Accordingly, whenever the transistor 107 is turned on, no current flows through the transistor 91, the diode bridge, and the transistor 95. Thus, current also cannot flow from the transistor 98 through the line 97 to the transistor 95 nor can it flow from the transistor 91 through the line 92 to the transistor 93.

When the transistor 107 is turned on, the diode bridge is turned off. Thus, the charge on the capacitor 106 is held at the instant at which the transistor 107 is turned on.

The diode bridge is symmetrically turned off because the current, which flows through the transistor 98, now flows through the resistor 100, the diodes 101 and 103, and the resistor 104 to the transistor 93. As a result of the voltage drop across the resistors 100 and 104 and the diodes 101 and 103, the voltage on the line 97 becomes higher than the voltage on the line 92. As a result, the diode bridge is symmetrically back biased so that no signal can flow therethrough from the amplifier 10 nor can the capacitor 106 discharge through the diode 76 or charge through the diode 75.

The transistor 107 is turned on only when an encode start strobe is supplied from the coaxial cable 32 through a line 108 to the base of an NPN transistor 109 with the transistor 109 being part of a differential current circuit, which also includes an NPN transistor 110.

The transistors 109 and 110 function as a differential current circuit only when an NPN transistor 111 is turned off. The transistor 111 is turned off only when a logical zero is supplied to its base through the line 35 from the second stage 30 of the shift register 28.

Thus, the encode start strobe can turn on the transistor 109 of the track and hold circuit 13 only when the second stage 30 of the shift register 28 is supplying a logical zero. This insures that the encode start strobe, which is supplied to all of the track and hold circuits 12–14 simultaneously from the coaxial cable 32, is effective only at the desired track and hold circuit. The logical zero signal, which is supplied to the base of the transistor 111, is more negative than the negative reference signal to the base of the transistor 110. Thus, current can flow through an NPN transistor 112 to a negative constant current source 113 only through the transistor 110 as the transistor 111 is turned off by the larger negative signal at its base.

Thus, with the logical zero signal being supplied to the base of the transistor 111, current flows only through the transistor 110 and not through the transistor 109, which has a more negative signal thereon. However, as soon as a signal, which is less negative than the negative reference signal to the base of the transistor 110, is supplied to the line 108, all of the current flows from the transistor 112 through a resistor 114, an NPN transistor 115, and the transistor 109 to the negative current source 113.

When this occurs, there is a voltage drop across the resistor 114 whereby the signal to the base of the transistor 107 decreases to turn on the transistor 107 and symmetrically back bias the diode bridge. Accordingly, whenever an encode start strobe is supplied and the base of the transistor 111 has a more negative signal thereon than the base of the transistor 110 due to the second stage 30 of the shift register 28 having a logical zero, the track and hold circuit 13 stores the last known signal level on the capacitor 106 for subsequent A/D conversion.

When the encode start strobe is supplied to the line 108, it also is supplied to the shift register 28 through the line 33. As a result, the logical zero is shifted one stage to the right in the shift register 28 so that the logical zero moves from the second stage 30 to the third stage 31. However, the period of time required to shift the logical zero from the second stage 30 to the third stage 31 takes longer than for the transistor 109 to be turned on. Accordingly, the signal from the second stage 30 to the lines 35 and 79 does not change from the logical zero to the logical one until after the transistor 109 has turned on.

Figure 3:
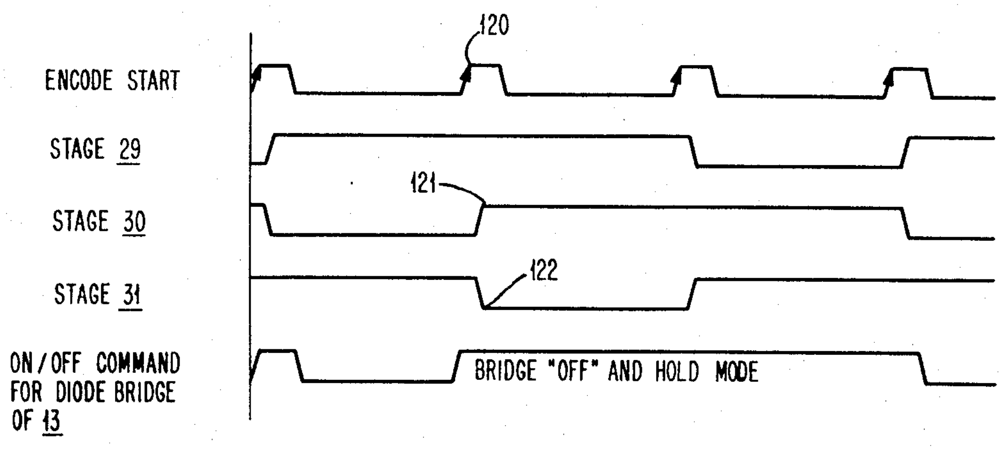
FIG. 3 is a timing chart showing the relationship between encoding signals and signals from the stages of a shift register.

This relation between the supply of the encode start strobe to the various track and hold circuits 12–14 in comparison with the shifting of the logical zero in the three stages 29–31 of the shift register 28 is shown in FIG. 3. Thus, the application of the encode start strobe to the track and hold circuit 13 is indicated at 120. However, the second stage 30 of the shift register 28 does not have a logical one until indicated at 121. When this occurs, the third stage 31 of the shift register 28 has a logical zero as indicated at 122 due to the shift of the logical zero.

When the output of the second stage 30 of the shift register 28 changes from a logical zero to a logical one, the voltage on the line 35 increases to turn on the transistor 111. As a result, when the encode start strobe starts to decrease so that the transistor 109 would turn off, the current continues to flow through the resistor 114 and the transistor 115 because the transistor 111 is turned on. Therefore, the transistor 107 remains turned on so that the diode bridge remains blocked.

When the signal on the line 79 becomes a logical one, the signal on the line 81 increases while the signal on the line 82 decreases. This results in the transistor 83 being turned off and the transistor 84 being turned on. The turning off of the transistor 83 turns on the transistor 85 so that there is a voltage drop across the resistor 87 whereby there exists a potential difference between the source and gate terminals of the field effect transistor, which forms the switch 61, whereby current cannot flow through the transistor. Thus, the line 20 is disconnected from the feedback line 63 when the switch 61 opens.

At the same time that the transistor 85 is turned on, the transistor 86 is turned off because the transistor 84 is turned on. Thus, the resistor 88 and the capacitor 89 are no longer effective as an impedance to the line 20 but the resistor 87 and the capacitance of the switch 61 now form the impedance to the line 20.

When the output from the third stage 31 of the shift register 28 becomes a logical zero as indicated at 122 in FIG. 3, the switch 62 turns on in the same manner as previously described for the switch 61 when the second stage 30 of the shift register 28 had a logical zero as its output. Thus, there is always feedback from one of the track and hold circuits 12–14 to the feedback line 63.

Figure 4:
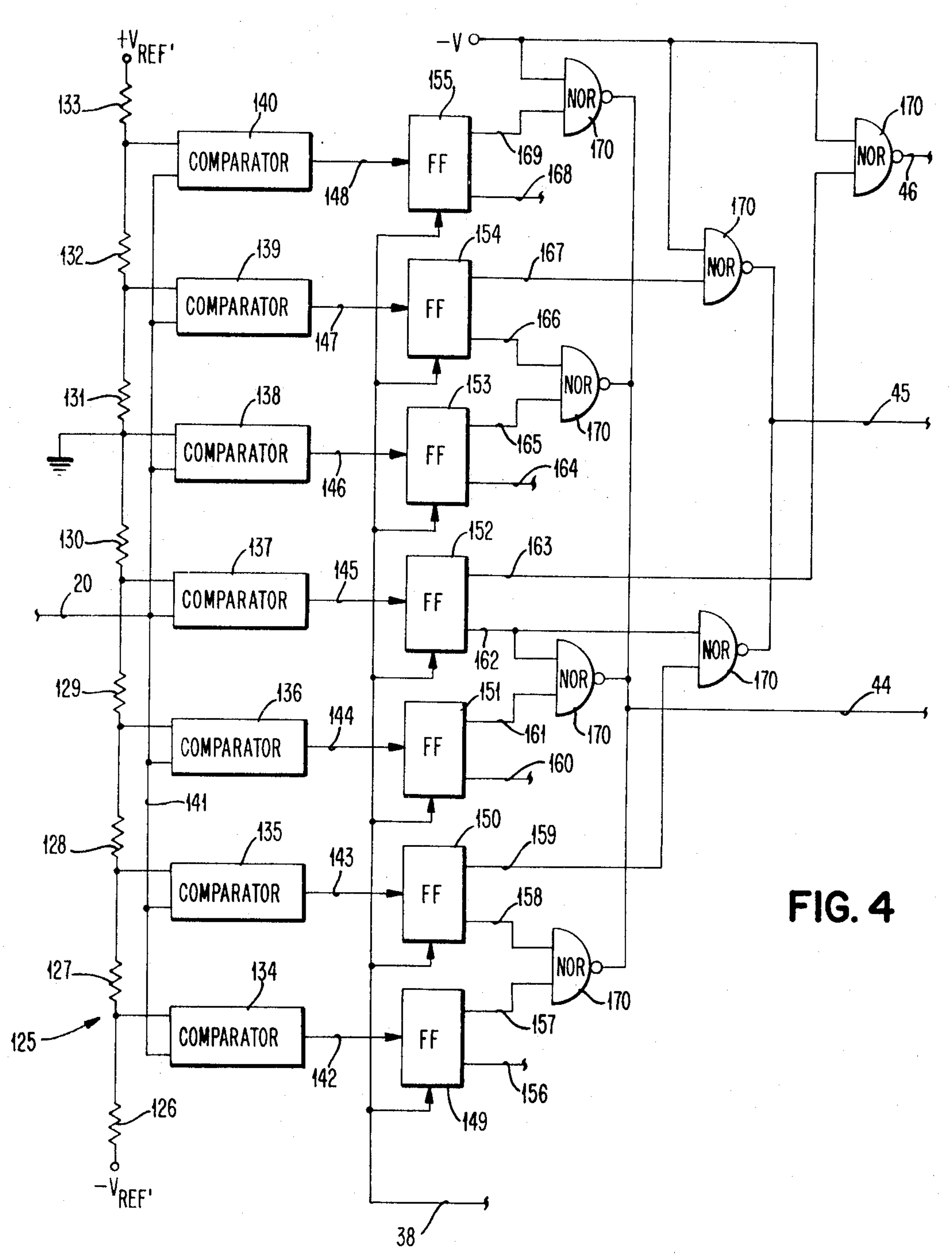
FIG. 4 is a schematic circuit diagram of a parallel A/D converter and a bar to binary circuit in one of the channels of the A/D converter of FIG. 1.

As previously mentioned, the output of the track and hold circuit 13 is continuously supplied through the line 20 to the A/D converter 21. As shown in FIG. 4, the A/D converter 21 includes a relatively low-impedance resistive voltage divider 125 having eight resistors 126, 127, 128, 129, 130, 131, 132, and 133 connected to each other in series between a positive reference voltage at the end of the resistor 133 and a negative reference voltage at the end of the resistor 126. The voltage divider 125 is grounded between the resistors 130 and 131. As will be explained hereinafter, the positive and negative reference voltages are not of equal and opposite magnitudes.

The A/D converter 21 also includes seven comparators 134, 135, 136, 137, 138, 139, and 140 with each of the comparators 134–140 having one input connected to one of seven equally spaced voltage taps of the voltage divider 125. The other input to each of the comparators 134–140 is connected to the line 20 through a line 141. Thus, each of the comparators 134–140 receives the same input from the line 20 and compares it with the voltage supplied to the particular comparator from the voltage divider 125.

One suitable example of the comparators 134–140 is sold by Motorola as Model MC1650 A/D comparator. Any other suitable comparator which is capable of comparing signals in a short period of time and producing an output in accordance therewith also may be employed.

The comparators 134–140 have their outputs connected through lines 142 to 148, respectively, to clocked latch flip flop circuits 149–155, respectively. Each of the flip flop circuits 149–155 may be any suitable clocked latch flip flop circuit such as the dual clocked latch flip flop circuit sold by Motorola as Model MC1669, for example.

The output of the flip flop circuit 149 comprises two lines 156 and 157 with the lines 156 and 157 having inverse logic signals thereon. Thus, if the line 156 of the flip flop 149 has a logical zero signal thereon, then the line 157 has a logical one and vice versa. The flip flop circuits 150–155 have output lines 158 and 159, 160 and 161, 162 and 163, 164 and 165, 166 and 167, and 168 and 169, respectively, with each pair of the output lines having inverse logical signals thereon.

The lines 157, 159, 161, 163, 165, 167, and 169 of the flip flop circuits 149–155, respectively, have a logical one thereon only when the input to the connected comparator from the line 141 is greater than the input to the connected comparator from the voltage divider 125. Accordingly, as the signal at the track and hold circuit 13 increases, more of the flip flop circuits 149–155 will have logical ones on the lines 157, 159, 161, 163, 165, 167, and 169, respectively, in ascending order from the flip flop circuit 149 to the flip flop circuit 155. If the voltage on the line 20 is not as large as the voltage at the tap between the resistors 126 and 127, then all of the flip flop circuits 149 to 155 would have logical zeros on the lines 157, 159, 161, 163, 165, 167, and 169, respectively, and logical ones on the lines 156, 158, 160, 162, 164, 166, and 168, respectively.

The outputs from the flip flop circuits 149 to 155 are latched when a low signal is supplied by the line 38 to each of the flip flop circuits 149 to 155 from the logic circuit 25. This can occur only when the voltage ramp crosses the first threshold.

The signals from the flip flop circuits 149 to 155 of the A/D converter 21 are supplied to the bar to binary circuit logic 41, which has a plurality of NOR gates 170. The NOR gates 170 have their inputs connected, as shown in FIG. 4, to some of the output lines of the flip flop circuits 149 to 155 to control the signals on the lines 44–46. The signals on the lines 44–46 are either logical zeros or logical ones. The signals on the lines 44–46 provide the most significant bits of the voltage, which is being sampled and held on the line 20.

Each of the lines 44–46 has a logical zero (high) when the output of any of the NOR gates 170 connected thereto is a high and has a logical one (low) when the outputs of all of the NOR gates 170 connected thereto are lows. One suitable example of the NOR gate 170 is sold by Motorola as Model MC1663 with the OR portion disconnected.

Each of the NOR gates 170 has a high output only when both of its inputs are lows. Thus, if both of the inputs to one of the NOR gates 170 are low, then the output of the NOR gate 170 is high. Thus, a logical zero appears on all the lines 44–46 which are connected to one of the NOR gates 170 having two low inputs.

When a high appears on one of the lines 44 to 46, this is interpreted as a binary one. Accordingly, when any of the four NOR gates 170, which are connected to the line 44, have a high output, the line 44 has a binary one signal thereon. This occurs when any of the even numbered comparators 134, 136, 138, and 140 has encoded a signal from the line 141 greater than the input threshold to the comparator from the voltage divider 125 while any higher numbered comparator has received a greater signal from the voltage divider 125 than from the line 141.

When either of the NOR gates 170, which is connected to the line 45, has a high (logical zero) output, the signal on the line 45 is a binary one. Likewise, when the output signal from the single NOR gate 170, which is connected to the line 46, is a high (logical zero), the signal thereon is a binary one.

From FIG. 4, it is readily recognized that the appearance of a logical one (a low) only on the line 157 of the odd numbered lines from the flip flop circuits 149 to 155 causes only the line 44 to have a logical zero (binary one) thereon. This indicates that the voltage is less than the voltage at the tap between the resistors 127 and 128 of the divider 125 and equal to or greater than the voltage at the tap between the resistors 126 and 127 of the voltage divider 125.

The voltage ramp is produced by discharging the capacitor 106. However, this does not occur until another encode start strobe is supplied through the line 33 to the shift register 28. When this occurs, the logical zero in the third stage 31 is shifted to the first stage 29 of the shift register 28.

When the pulse on the line 53 from the first stage 29 of the shift register 28 goes low due to the first stage having the logical zero therein, this low, which is supplied to the track and hold circuit 13, causes the capacitor 106 to discharge. As shown in FIG. 2, the low on the line 53 is supplied to an OR/NOR gate 175, which may be the same type as the gate 80. This changes the states of NPN transistors 176 and 177 whereby a PNP transistor 178 ceases to conduct.

When the transistor 178 conducts, a blocking diode 179 has its cathode voltage higher than the maximum voltage to which the capacitor 106 can be charged to prevent discharge thereof. When the transistor 178 is turned off, the cathode of the diode 179 has a voltage so low that the capacitor 106 may freely discharge through the diode 179 to a negative constant current source, which comprises NPN transistors 180 and 181. The emitter of the transistor 181 is connected through a trim resistor 182 to a negative voltage source.

A PNP transistor 183, which is connected to a positive voltage source through a resistor 184 and to ground through a Zener diode 185, is always turned off. It only supplies a leakage compensation current to the capacitor 106.

Accordingly, when the line 53 has a low thereon due to the first stage 29 of the shift register 28 having a logical zero therein, the capacitor 106 discharges at a constant rate. Because of the high input impedance of the buffer amplifier 78, the capacitor 106 can never discharge through the amplifier 78. The function of the amplifier 78 is to buffer or convert a high impedance node at the capacitor 106 to a low impedance source for transmission through the line 20.

The discharge of the capacitor 106 through the negative constant current source starts a ramp discharge. This is supplied through the line 20 to the comparators 134 to 140.

At the same time that the low is supplied through the line 53 to start the ramp discharge of the capacitor 106, the low also is supplied through the line 54 to one of the AND gates 48. Because the encode start strobe also has been supplied through the line 33 at this time (As is evident from FIG. 3, the encode start strobe lasts long enough to coincide with the shift in the signals in the shift register 28.), a signal is supplied to the timer 50. Thus, the timer 50, which comprises a sixteen-tap delay line, has an effective wave front moving up the delay line at a rate of two nanoseconds per tap; this is a rate proportional to the discharge rate of the capacitor 106.

Each of the sixteen taps of the timer 50 is connected to a different one of 16 flip flop circuits 186 to 201 (see FIG. 5), which form the latches of the delay line and latches circuit 51. One suitable example of the flip flop circuits 186 to 201 is the dual clocked latch flip flop circuit which is sold as Model MC1669 by Motorola. Any other suitable flip flop circuit may be employed if two outputs therefrom are inverse with one being a logical zero and the other a logical one and the outputs can be latched in either condition.

The flip clop circuits 186 to 201 also receive an input from a line 202, which receives signals from each of the logic circuits 24, 25, and 26 through lines 204, 205, and 206, respectively, connected thereto. The flip flop circuits are latched whenever there is a high on any of the lines 204 to 206.

Figure 9:
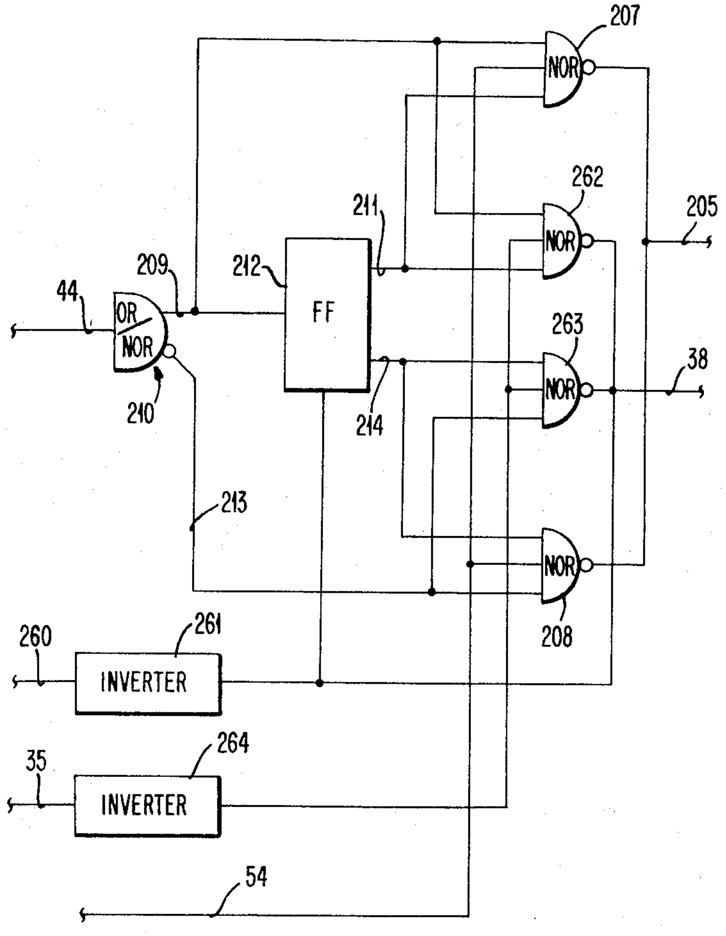
FIG. 9 is a schematic circuit diagram of a first comparator threshold cross logic circuit in one of the channels of the A/D converter of FIG. 1.

As shown in FIG. 9, the line 205 is connected to the outputs of NOR gates 207 and 208 of the first comparator threshold cross logic circuit 25. One suitable example of the NOR gates 207 and 208 is the OR/NOR gate which is sold as model MC1661 by Motorola with the OR output disconnected. Furthermore, only three of the inputs of the model MC1661 gate are used.

Latching of the flip flop circuits 186 to 201 occurs only when there is a high on the line 205. This can occur only when all of the inputs to one of the NOR gates 207 and 208 are low.

The NOR gate 207 has one of its inputs connected to output 209 of an OR/NOR gate 210, which has its input connected to the line 44. Another of the inputs to the NOR gate 207 is from output line 211 of a dual clocked latch flip flop circuit 212, which receives its data from the output 209 of the gate 210. One suitable example of the flip flop circuit 212 is the dual clocked latch flip flop circuit which is sold as Model MC1669 by Motorola.

The third of the three inputs to the NOR gate 207 is from the first stage 29 of the shift register 28 through the lines 53 and 54. This is the same signal as is supplied to the track and hold circuit 13 to initiate the ramp discharge. Thus, when discharging of the capacitor 106 starts, the signal on the line 54 is a low. This also is an input to the NOR gate 208.

The NOR gate 208 has a second input connected to output 213 of the OR/NOR gate 210. This is the inverse signal of that on the output 209 irrespective of the input to the OR/NOR gate 210 from the line 44.

Another of the inputs to the NOR gate 208 is output line 214 of the flip flop circuit 212. The signal on the output line 214 is the opposite to the signal on the output line 211 of the flip flop circuit 212 because these two signals are the inverse of each other.

Accordingly, when the signal on the line 54 from the first stage 29 of the shift register 28 becomes a low, one of the NOR gates 207 and 208 produces a high when the signal on the line 44 changes. This change in state of the signal on the line 44 occurs when the discharge of the capacitor 106 creates a decrease in the voltage on the line 141 to the extent that one of the comparators 134–140 changes its output state.

As the logic of FIG. 4 clearly indicates, the signal on the line 44 changes when the output of one of the comparators changes its state. Thus, for example, if it is assumed that the comparators 134, 135, and 136 of the A/D converter 21 produced outputs on the lines 142, 143, and 144, respectively, because the signal on the line 20 was greater than the voltage between the resistors 128 and 129, then the signal had a magnitude less than that at the tap between the resistors 129 and 130 to which the comparator 137 is connected. Thus, as the capacitor 106 discharges, the signal on the line 20 decreases toward the voltage at the tap between the resistors 128 and 129.

Figure 6:
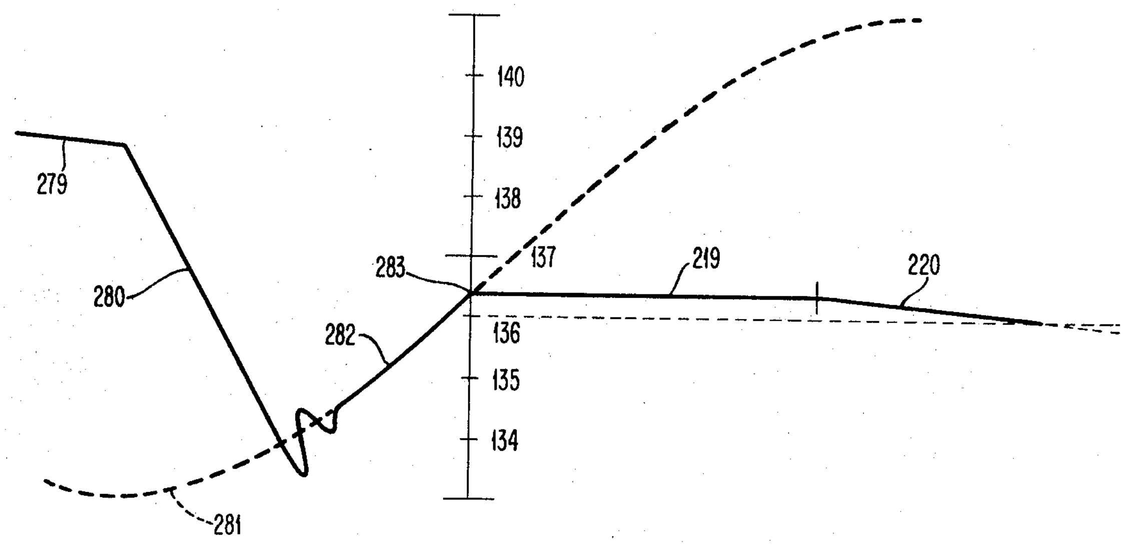
FIG. 6 is a graph showing the relationship of the signal on the holding capacitor to the analog signal and to the comparators of the parallel A/D converter of FIG. 4.

This is shown in FIG. 6 wherein the magnitude of the voltage to turn on the various comparators 134 to 140 is indicated by the various ordinates. As shown in FIG. 6, the held or sample voltage, which was on the line 20 and is indicated by 219 in FIG. 6, has its ramp discharge as indicated at 220. When the ramp discharge from the capacitor 106 discharges through the negative current source, it eventually causes the signal on the output line 144 of the comparator 136 to change when the voltage on the capacitor 106 is equal to the voltage at the tap between the resistors 128 and 129. This is the first zero threshold crossing of one of the comparators.

When this occurs, the signal on the output line 144 of the comparator 136 changes state. When this occurs, the signal is supplied through the line 205 to the line 202 to the flip flop circuits 186 to 201.

When this signal is supplied through the line 202, the flip flop circuits 186 to 201, which have previously received a signal from the timer 50 due to the propogation of the wave front on the delay line, will each have a different output signal than the flip flop circuits 186 to 201, which have not received the signal from the timer 50. Since the ramp discharge of the capacitor 106 is at a fixed rate, the number of the flip flop circuits 186 to 201, which have received a signal from the timer 50, will indicate the time required for the capacitor 106 to discharge until the output of one of the comparators 134–140 is changed to the opposite signal. This will indicate the amount that the signal exceeded the magnitude of the voltage at a tap between two of the resistors of the voltage divider 125.

Each of the flip flop circuits 186 to 201 has a pair of output lines extending therefrom with one of the lines having a logical zero thereon and the other having a logical one. Thus, the flip flop circuit 186 has lines 221 and 222 with the line 221 having a logical one and the line 222 having a logical zero thereon when there is no input to the flip flop circuit 186 from the timer 50 and the line 222 having a logical one and the line 221 having a logical zero thereon when there is an input to the flip flop circuit 186 from the timer 50.

Each of the flip flop circuits 187 to 201 has a similar pair of output lines with these lines identified as 223 to 252. The odd numbered output lines (223 etc.) correspond to the line 221 while the even numbered output lines (224 etc.) correspond to the output line 222.

Figure 5:
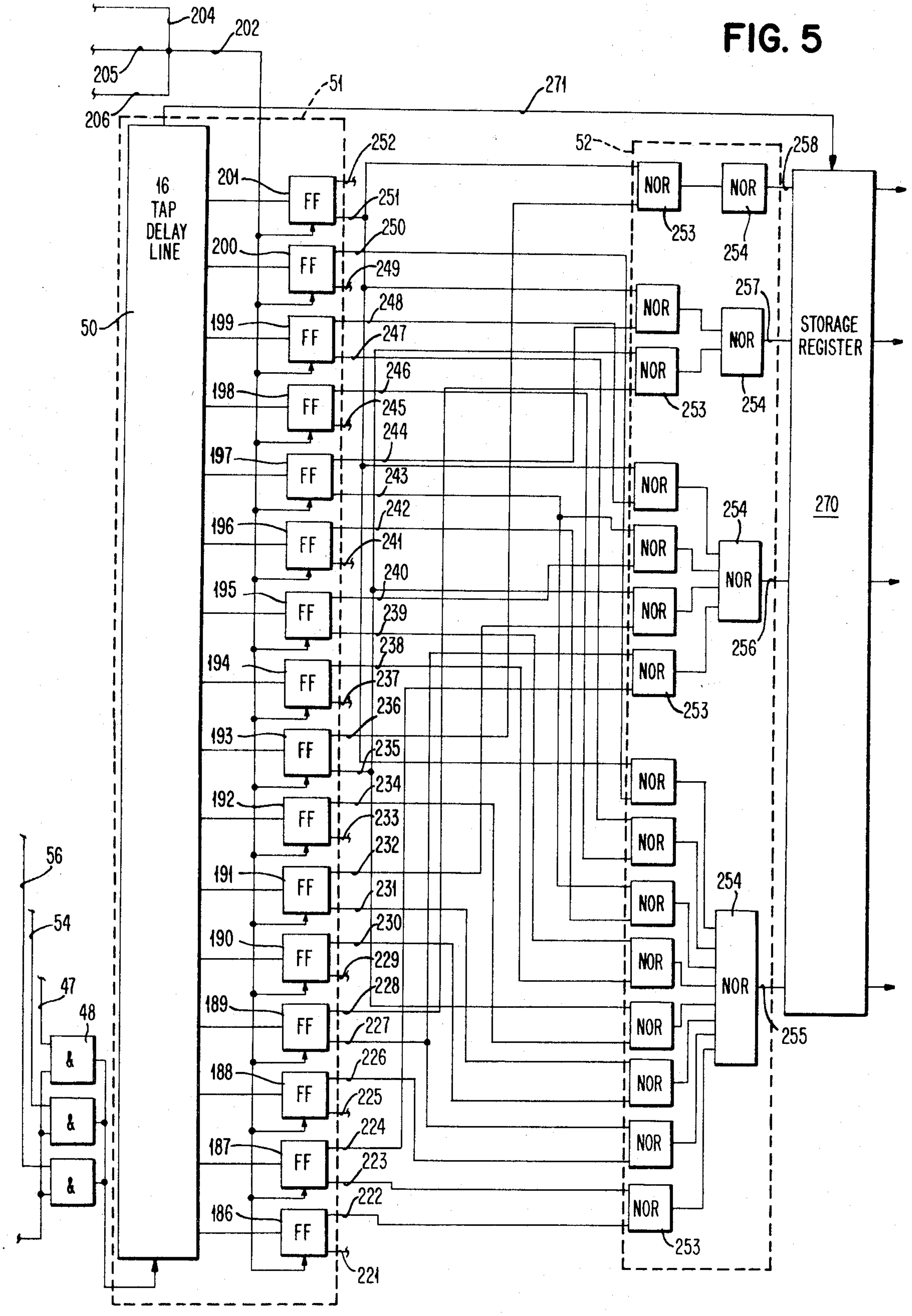
FIG. 5 is a schematic circuit diagram of the portion of the A/D converter of FIG. 1 for converting the ramp conversion portion of the analog signal to the least significant bits of the output.

The bar to binary logic circuit 52 has a plurality of NOR gates 253 connected to some of the output lines 221 to 252 of the flip clop circuits 186 to 201 as shown in FIG. 5. The NOR gates 253 are connected to other NOR gates 254, which have output lines 255 to 258 connected thereto. The lines 255 to 258 provide the least significant bits of the signal at the track and hold circuit with the line 255 providing the least significant bit of these four least significant bits and the line 258 providing the most significant of these four least significant bits.

One suitable example of the NOR gate 258 is the same as the NOR gates 170. One suitable example of the NOR gates 254 is sold by Motorola as Model MC1661.

The function performed by the logic of FIG. 5 is to decode or compress the digital information on the output lines 221–252 of the flip flop circuits 186 to 201 to a more efficient binary representation. This logic will be explained for two situations.

First, when the sixteen tap delay line has no signal outputed on the input lines to the flip flop circuits 186 to 201, all of the odd numbered lines 221 to 251 are high and all of the even numbered lines 222 to 252 are low. That is, each of the two input NOR gates 253 has one high and one low input to cause all inputs to the NOR gates 254 to be lows (logical ones) so that the outputs on the lines 255 to 258 are highs (logical zeros).

As the pulse or wave front travels up the tapped delay line, outputs from the flip flop circuits 186 to 201 change from a low state to a high state in succession at a known rate. Since all the even numbered output lines 222 to 252 of the flip flop circuits 186 to 201 follow the data (high or low) on the corresponding input lines to the flip flop circuits 186 to 201, it is clear from the logic diagram that the outputs on the lines 255 to 258 will change in a binary fashion as a function of how far a wave front propogates up the delay line before a signal from a first zero crossing through the line 202 freezes the state of the flip flop circuits 186 to 201.

Second, if the input to the flip flop circuit 186 switches to the high state, then the lowermost of the NOR gates 253 connected through the NOR gate 254 to the line 255 in FIG. 5 now has two low voltages as inputs (two logical ones). Thus, its output switches to a high, and the output line 255 to a low (logical one).

If the magnitude of the signal is such that the two flip flop circuits 186 and 187 have high voltages on their output lines 222 and 224 and lows on the lines 221 and 223, then the lowermost of the NOR gates 253 connected through the NOR gate 254 to the line 255 once again has one high input and one low input and the lowermost of the NOR gates 253 connected through the NOR gate 254 to the line 256 has two low inputs. Thus, there is an output only on the line 256. It is believed that the logic for the remainder of the lines 255 to 258 is readily obvious so that the signal on each of the lines 255 to 258 depends upon the magnitude of the signal being discharged from the capacitor 106 in comparison with the magnitude of the signal parallel converted.

The flip flop circuit 212 (see FIG. 9) becomes responsive to a data supply through the output line 209 from the gate 210 at the same time that the ramp discharge in the capacitor 106 starts. This is accomplished through connecting the line 43 through a line 260 to an inverter 261. At this time, the third stage 31 has a logical one (a high) stored therein so that the input to the flip flop circuit 212 from the output of the inverter 261 is a low. Thus, the flip flop circuit 212 is activated when a low is supplied thereto. This is at the same time that a low has been supplied to the track and hold circuit 13 through the line 53 from the first stage 29 of the shift register 28. Thus, the signals on the output lines 211 and 214 of the flip flop circuit 212 correspond to the data input from the output line 209 of the OR/NOR gate 210 as soon as the ramp discharge starts.

Furthermore, the low from the inverter 261 is supplied to the line 38. Thus, a high is no longer supplied to the line 38 from the inverter 261 as did exist during the parallel conversion when the output of the third stage 31 of the shift register 28 was a logical zero. During the parallel conversion when the inverter 261 had a high output, none of the flip flop circuits 149 to 155 could be latched.

However, even though the signal from the inverter 261 goes to a low whereby this would latch the flip flop circuits 149 to 155, this does not occur since the output from one of NOR gates 262 and 263, which have their outputs connected to the line 38, is a high since all of the inputs are low. The output of the other of the gates 262 and 263 is a low since at least one of its inputs is a high.

One of the inputs to the NOR gate 262 is a signal from the output line 209 of the OR/NOR gate 210. This is the same signal as supplied to the NOR gate 207.

The NOR gate 262 also receives an input from the output of an inverter 264, which inverts the signal on the line 35 from the second stage 30 of the shift register 28. Thus, during both the parallel conversion and the ramp discharge of the analog signal, the signal on the output of the inverter 264 is a low since the line 35 has a high thereon at these times. Therefore, during parallel and ramp conversions of the analog signal, the input to the NOR gate 262 from the inverter 264 is a low.

The third input to the NOR gate 262 is from the output line 211 of the flip flop circuit 212. As previously mentioned, this signal is locked as soon as the ramp discharge starts.

The input to the NOR gate 263 includes the output of the inverter 264. The NOR gate 263 also is connected to the output 213 of the OR/NOR gate 210 and to the output line 214 of the flip flop circuit 212.

When the signal on the line 44 (see FIGS. 4 and 9) changes state because of the discharge of the capacitor 106 causing the output of one of the comparators 134 to 140 to change state, the combined outputs from both of the NOR gates 262 and 263 (see FIG. 9) become lows. When this occurs, the flip flop circuits 149 to 155 are latched.

At the same time that both of the outputs of the gates 262 and 263 become low, the outputs of the gates 207 and 208 also become low. This supplies a signal through the lines 205 and 202 to lock the flip flop circuits 186 to 201.

Because the output of the inverter 264 changes state at the end of the ramp conversion due to the second stage 30 of the shift register 28 again having a logical zero stored therein, the output of the inverter 264 becomes a high. This insures that the outputs of the gates 262 and 263 remain low during the readout of the signal from channel two.

When another parallel conversion of the analog signal in the track and hold circuit 13 is to begin, the output of the inverter 261 becomes high since the third stage 31 of the shift register 28 has the logical zero (a low) at this time. This results in a high being supplied through the line 38 to the flip flop circuits 149 to 155 to remove any signal thereon therefrom so that the flip flop circuits 149 to 155 respond to the outputs of the comparators 134 to 140.

The signals in the bar to binary logic circuit 52 are transferred from the lines 255 to 258 to a storage register 270 (see FIG. 5) at the start of the track and readout portion of the cycle. The storage register 270 receives a signal from the timer 50 through a line 271 when the pulse on the 16 tap delay line has completed its travel over the length of the delay line. Thus, the storage register 270 receives the signals from the lines 255 to 258 when the ramp conversion is completed and readout is to be accomplished. It is necessary to make this transfer at this time because the flip flop circuits 186 to 201 must again be ready to be latched when the pulse for channel three (the track and hold circuit 14) is supplied to start the timer 50 as the threshold crossover could occur as soon as the ramp discharge starts.

At the time that track and readout of channel two starts, the signals on the lines 44 to 46 must be removed therefrom since the flip flop circuits 149 to 155 are no longer latched. Accordingly, a channel select logic circuit 272 (see FIG. 1) of channel two includes a storage register. This storage register is activated when there is a low on the line 35, which is when the second stage 30 of the shift register 28 has the logical zero stored therein. The channel select logic circuit 272 also supplies the signals on the storage register to output lines 273, 274, and 275, which have the same signals as were on the lines 44, 45, and 46, respectively, at the time of storing.

The signal which is finally supplied from the lines 44 to 46 to the storage register of the circuit 272 is one bit lower than the initial signal when the parallel conversion is made. This is because there is a change of one bit during the ramp conversion as this change in the signal on the line 44 is employed to determine when the ramp discharge crosses the first threshold.

Therefore, the voltage divider 125 has the reference voltages biased one bit lower than the actual reference voltages which would be employed if there were not the change of the signal in the ramp conversion. As a result of this biasing of the reference voltages down one bit, the signal on the lines 44 to 46 at the completion of the ramp conversion provides the most significant bits of the analog signal.

Thus, the positive reference voltage applied to the voltage divider 126 is reduced from what it would be if the signal on the line 44 were not changed by the ramp conversion by a voltage equal to that across one of the resistors of the voltage divider 125. The negative reference voltage applied to the voltage divider 125 is increased from what it would be if the signal on the line 44 were not changed by the ramp conversion by a voltage equal to that across one of the resistors of the voltage divider 125.

While only the track and hold circuit 13 and the A/D converter 21 have been shown and described in detail, it should be understood that the track and hold circuit 12 and the A/D converter 19 for channel one and the track and hold circuit 14 and the A/D converter 23 for channel three have similar circuits. Thus, the same sequence of operations is occurring in each of the channels at different times. That is, when the encode start strobe is received at one of the channels such as channel one, for example, channel two is having its output read and the analog signal tracked while channel three is having the ramp conversion to obtain the least significant bits.

Figure 8:
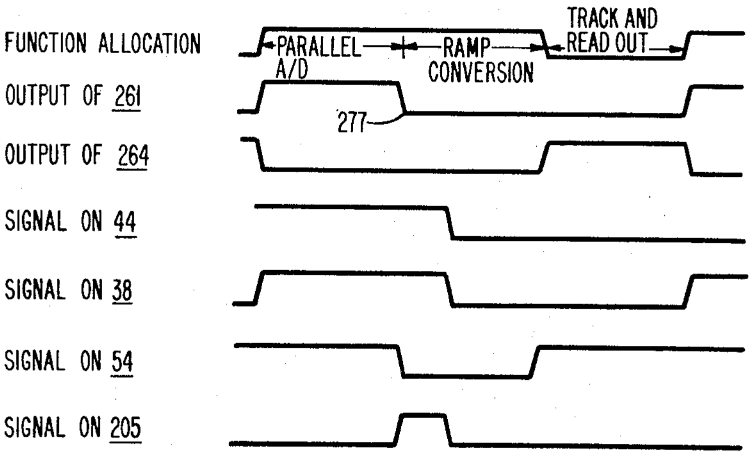
FIG. 8 is a timing chart showing the relationship of various signals in the circuit of FIG. 9 with respect to the various functions in one of the channels.

As shown in FIG. 8, the parallel conversion of the most significant bits in channel two occurs during the first 30 nanoseconds of the ninety nanosecond period in which an entire sequence in the channel occur. During this time, the output of the inverter 261 is a high as indicated at 276 in FIG. 8 whereby the flip flop circuits 149 to 155 of the bar to binary logic circuit 41 are not latched. Thus, the flip flop circuits 149 to 155 respond to the outputs of the comparators 134 to 140 during this time.

The ramp conversion, which begins at the start of the next thirty nanoseconds, is started when the shift register 28 receives the encode strobe pulse. This is when the logical zero in the shift register 28 is shifted from the third stage 31 to the first stage 29.

At this time, the output of the inverter 261 becomes a low as indicated at 277 in FIG. 8. This turns on the flip flop circuit 212 to latch signals on the output lines 211 and 214 in accordance with the signal on the line 44. Since the output of the inverter 261 is now a low, it no longer is effective to hold the flip flop circuits 149 to 155 in a condition so that they follow the inputs from the comparators 134 to 140. However, the output of one of the gates 262 and 263 becomes a high at this time so that the flip flop circuits 149 to 155 are not latched when the output of the inverter 261 becomes a low.

Accordingly, during this middle 30 nanoseconds of the 90 nanosecond period, the ramp discharge changes the signal on the line 44. When this occurs, then neither the gate 262 nor the gate 263 produces a high since each of the gates has at least one high input. This is because the outputs from the flip flop circuit 212 do not change state when the output from the line 44 changes state because the flip flop circuit 212 was latched at the start of the ramp conversion cycle by the low from the inverter 261.

The time when the first threshold in channel two is crossed depends upon the held signal in the track and hold circuit 13. Likewise, the crossing of the threshold in channel one depends upon the signal in the track and hold circuit 12 while the crossing of the first threshold in channel three is determined by the signal in the track and hold circuit 14. Since these signals can vary substantially, the time when the threshold is crossed can vary for each channel. However, the timer 50 continues to have the wave front propogated up the delay line until the pulse has moved to the end of the delay line.

During the final 30 nanoseconds of the 90 nanosecond period, the analog signal, which was held in the track and hold circuit 13, is read from the lines 273 to 275 and 255 to 258. Thus, the most significant bits are on the lines 273 to 275, and the least significant bits are on the lines 255 to 258.

Figure 7:
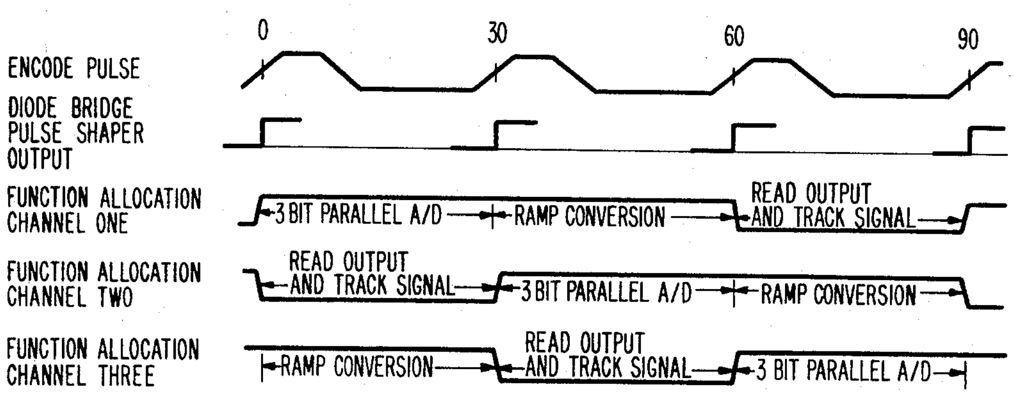
FIG. 7 is a timing chart showing the relationship of the various functions in each of the channels of the A/D converter of the present invention.

As shown in FIG. 6 for channel two, the ramp for the previous cycle is shown discharging, as indicated at 279, until completion of the conversion portion of the cycle. Then, during the read output and track signal time of FIG. 7, the capacitor slews at a rate of approximately 250 millivolts per nanosecond. This is indicated by line 280 in FIG. 6.

As the analog signal, which is an AC signal and indicated by 281, begins to rise, the amplifier 78 of the track and hold circuit 13 starts to track the signal so that the capacitor 106 charges along line 282, which also is the sine wave of the analog signal 281. The charge on the capacitor 106 is locked in the capacitor 106 when the encode start strobe is supplied to the track and hold circuit 13 from the coaxial cable 32. This locking of the signal is indicated at 283, and it is this magnitude of this signal that it is desired to convert to a digital signal.

Since this signal is greater than the voltage between the resistors 128 and 129 of the voltage divider 125, the comparators 134, 135, and 136 provide outputs on the lines 142 to 144, respectively. The other comparators 137 to 140 do not have a change in the signals on the output lines 145 to 148, respectively.

The description of how the least significant bits are obtained by discharging the capacitor 106 have been previously discussed. The discharge continues from the capacitor 106 along the line 220 until the diode bridge of the track and hold circuit 13 is again unblocked to allow the amplifier 78 to respond to the signals from the amplifier 10. There is a sufficient period of time to enable the capacitor 106 to discharge an amount equal to the magnitude of the voltage across one of the resistors of the voltage divider 125 since the voltage on the capacitor could almost be that of the next of the comparators.

While the present invention has been shown and described with respect to a plurality of channels, it should be understood that the A/D converter could be employed with a single channel. Likewise, while three channels have been shown, it should be understood that the number of channels may be varied as desired.

While the present invention has shown and described the parallel A/D converter as converting the three most significant bits during the first part of the conversion cycle with the four least significant bits being determined by a ramp conversion during the last part of the conversion cycle through using the comparators of the parallel A/D converter as threshold detectors, it should be understood that the number of bits during each of the parallel and ramp portions of the conversion cycle may be varied as desired. Thus, the particular number of bits in each portion of the conversion cycle is dependent upon the number of comparators used, the time available to perform the total conversion, and the total number of components that are to be tolerated.

An advantage of this invention is that it reduces the hardware cost for a wideband A/D converter. Another advantage of this invention is that only a single output accumulator is used for all channels. A further advantage of this invention is that there is no recovery time problem since the inverting amplifier, which supplies the analog signal to each of the track and hold circuits, never becomes saturated. Still another advantage of this invention is that there is no static gain between the channels since only a single feedback resistor is employed with all of the channels and only a single input resistor is used.

For purposes of exemplification, a particular embodiment of the invention has been shown and described according to the best present understanding thereof. However, it will be apparent that changes and modifications in the arrangement and construction of the parts thereof may be resorted to without departing from the spirit and scope of the invention.

What is claimed is:

1. An analog to digital converter comprising:

input means supplying an analog signal;

means including a capacitor to hold a signal received from said input means;

means to parallel convert the held signal at said holding means to produce the most significant bits of the held signal;

means to convert said held signal into a ramp signal;

said ramp converting means including means to discharge said capacitor to produce a voltage ramp; and means to determine when the voltage ramp from the discharge of said capacitor reaches a first threshold to produce the least significant bits of said held signal from said ramp signal.

2. The analog to digital converter according to claim 1 in which said parallel converting means includes comparing means to produce the most significant bits of the held signal.

3. The analog to digital converter according to claim 2 in which said ramp conversion means cooperates with said comparing means of said parallel converting means to obtain the least significant bits of the held signal after obtaining the most significant bits of said held signal.

4. The analog to digital converter according to claim 3 including:

means to connect and disconnect said holding means and said input means;

and said holding means holding the signal from said input means at the time of disconnection of said holding means from said input means.

5. The analog to digital converter according to claim 4 including:

means to connect the output of said holding means to said input means to feed back the output of said holding means to said input means;

and said connect and disconnect means includes means to disconnect said feedback connecting means when said holding means has its input disconnected from said input means.

6. The analog to digital converter according to claim 1 including:

means to connect and disconnect said holding means and said input means;

and said holding means holding the signal from said input means at the time of disconnection of said holding means from said input means.

7. The analog to digital converter according to claim 6 including:

means to connect the output of said holding means to said input means to feed back the output of said holding means to said input means;

and said connect and disconnect means includes means to disconnect said feedback connecting means when said holding means has its input disconnected from said input means.

8. A multichannel analog to digital converter comprising:

a single input circuit;

a plurality of first means with each of said first means sampling and holding a signal from said input circuit, said plurality of first means being equal to the number of channels;

second means to control when each of said first means is connected to and disconnected from said input circuit;

a plurality of parallel converting means equal in number to said first means;

each of said parallel converting means being connected to a corresponding one of said first means to receive the output of said first means as an input;

means to control when said parallel converting means produces a first output corresponding to the most significant bits of the signal held at said first means when said first means is disconnected from said input circuit;

means to cause a ramp to be supplied from said first means to said connected parallel converting means;

and means to produce a second output in accordance with the ramp from said first means with the second output being the least significant bits of the signal held at said first means when said first means is disconnected from said input circuit.

9. The analog to digital converter according to claim 8 including:

means to feed back the output of each of said first means to said input circuit as a feedback signal;

and means to control when the output of each of said first means is fed back to said input circuit.

10. The analog to digital converter according to claim 9 in which said control means renders said feedback means effective to allow the output of each of said first means to be fed to said input circuit when said first means is connected to said input circuit by said second means to receive the signal therefrom as an input.

11. The analog to digital converter according to claim 8 in which each of said parallel converting means includes comparing means to produce the most significant bits of the signal held at said first means when said first means is disconnected from said input circuit by said second means.

12. The analog to digital converter according to claim 8 in which:

each of said first means includes a capacitor holding the held signal;

and means to cause discharge of said capacitor to produce the ramp.

13. The analog to digital converter according to claim 8 including threshold means responsive to the ramp from said first means.

14. A multichannel analog to digital converter comprising:

a single input circuit;

three channels connected to said input circuit;

each of said channels including:

means to hold a signal received from said input circuit;

means to parallel convert the held signal at said holding means to produce the most significant bits of the held signal;

means to convert said held signal to a ramp signal after obtaining said most significant bits;

means to produce the least significant bits of the held signal from said ramp signal;

and means to track the signal from said input circuit;

and means to control each of said channels to cause each of said channels to have a different function occurring therein at the same time, said controlling means causing said parallel converting means to be effective in one of said channels while said ramp conversion means is effective in a second of said channels and said tracking means is effective in the third of the channels.

* * * * *